(12) United States Patent
Oh et al.

(10) Patent No.: US 7,855,142 B2
(45) Date of Patent: Dec. 21, 2010

(54) METHODS OF FORMING DUAL-DAMASCENE METAL INTERCONNECT STRUCTURES USING MULTI-LAYER HARD MASKS

(75) Inventors: Young Mook Oh, Gyeonggi-do (KR); Youngjin Choi, Hopewell Junction, NY (US)

(73) Assignees: Samsung Electronics Co., Ltd. (KR); International Business Machines Corporation, Armonk, NY (US)

( * ) Notice: Subject to any disclaimer, the term of this patent is extended or adjusted under 35 U.S.C. 154(b) by 163 days.

(21) Appl. No.: 12/351,110

(22) Filed: Jan. 9, 2009

(65) Prior Publication Data

US 2010/0178771 A1 Jul. 15, 2010

(51) Int. Cl.
*H01L 21/4763* (2006.01)
(52) U.S. Cl. .................. 438/634; 438/638; 438/952; 257/E21.579
(58) Field of Classification Search ............ 438/950, 438/952, 970
See application file for complete search history.

(56) References Cited

U.S. PATENT DOCUMENTS

| | | | |
|---|---|---|---|
| 5,091,339 A | 2/1992 | Carey | |
| 6,498,092 B2 * | 12/2002 | Lee et al. | 438/634 |
| 6,767,826 B2 * | 7/2004 | Abe | 438/638 |
| 6,911,397 B2 | 6/2005 | Jun et al. | |
| 7,088,003 B2 | 8/2006 | Gates et al. | |
| 7,115,517 B2 | 10/2006 | Ye et al. | |
| 7,226,853 B2 * | 6/2007 | Bekiaris et al. | 438/622 |

OTHER PUBLICATIONS

He et al., "Bottom Anti-Reflective Coatings (BARCs) for 157-nm Lithography," Proceedings of Society of Photo-Optical Instrumentation Engineers: Advances in Resist Technology and Processing XXI, vol. 5376, 2004, 7 pages.
Su et al. "Integration of Cu and Extra Low-k Dielectric (k=2.5~2.2) for 65/45/32nm Generations," IEEE, 2005, 4 pages.

* cited by examiner

*Primary Examiner*—Chandra Chaudhari
(74) *Attorney, Agent, or Firm*—Myers Bigel Sibley & Sajovec

(57) ABSTRACT

Methods of forming dual-damascene metal interconnect structures include forming an electrically insulating layer on an integrated circuit substrate and then forming a hard mask layer on the electrically insulating layer. The hard mask layer may include a stacked composite of at least four electrically insulating material layers therein. The hard mask layer may also have separate trench and via patterns therein that are respectively defined by at least first and second ones of the electrically insulating material layers and at least third and fourth ones of the electrically insulating material layers.

18 Claims, 19 Drawing Sheets

METHODS OF FORMING DUAL-DAMASCENE METAL INTERCONNECT STRUCTURES USING MULTI-LAYER HARD MASKS

FIELD OF THE INVENTION

The present invention relates to methods of forming integrated circuit devices and, more particularly, to methods of forming integrated circuit devices having metal interconnect structures therein.

BACKGROUND OF THE INVENTION

Methods of forming dual-damascene metal interconnect structures frequently utilize relatively low-k dielectric materials to separate layers of metallization from each other and thereby lower parasitic inter-metal capacitance between overlapping metallization patterns, enhance operating speed of integrated circuits and suppress inter-metal crosstalk, for example. Unfortunately, low-k dielectric materials that are formed using organic polymers may be susceptible to damage during selective etching and other related processing steps. For example, some conventional low-k dielectric materials may be susceptible to plasma ashing damage caused when photoresist masks are removed. Some damascene process techniques have been developed to limit ashing damage to organic polymers that may be used as low-k dielectric materials. One such technique, which is illustrated by FIGS. 2A-2J of U.S. Pat. No. 6,911,397 to Jun et al., utilizes a dual hard mask layer to form an interconnection groove pattern within lower and upper insulating layers. Unfortunately, this damascene process technique is relatively complicated and may result in misalignment errors and/or the formation of undesirable photoresist tails. Thus, notwithstanding efforts to limit ashing damage to low-k dielectric materials, there continues to be a need for less complicated damascene process techniques that reduce a likelihood of ashing damage and misalignment errors.

SUMMARY OF THE INVENTION

Methods of forming dual-damascene metal interconnect structures according to embodiments of the present invention include forming an electrically insulating layer on an integrated circuit substrate and then forming a hard mask layer on the electrically insulating layer. The hard mask layer may include a stacked composite of at least four electrically insulating material layers therein. The hard mask layer may also have separate trench and via patterns therein that are respectively defined by at least first and second ones of the electrically insulating material layers and at least third and fourth ones of the electrically insulating material layers. The first and second ones of the electrically insulating material layers are formed of first and second different insulating materials and the third and fourth ones of the electrically insulating material layers are formed of third and fourth different insulating materials. The hard mask is used as an etching mask to selectively etch the electrically insulating layer and thereby reflect the shape of the trench and via patterns within the electrically insulating layer.

The step of forming the hard mask layer may include photolithographically patterning the stacked composite of the at least four electrically insulating material layers to define the trench pattern and the via pattern therein. The at least four electrically insulating material layers may include at least four dielectric layers having respective dielectric constants that are greater than a dielectric constant of the electrically insulating layer. The at least four dielectric layers may also include an alternating arrangement of first and second dielectric layers having respective first and second unequal dielectric constants. In particular, the first dielectric layer may be an oxide layer and the second dielectric layer may include a material selected from a group consisting of SiCN, SiOC, SiOCN, SiC, SiON and SiN. In addition, the electrically insulating layer may be formed of an ultra-low dielectric constant material having a dielectric constant in a range between about 2.2 and about 2.4, such as SiCOH. According to additional embodiments of the invention, the stacked composite of at least four electrically insulating material layers may include a composite of three oxide layers, and two dielectric layers containing a material selected from a group consisting of SiCN, SiOCN, SiC, SiON and SiN.

According to still further embodiments of the present invention, methods of forming dual-damascene metal interconnects may include forming an inter-metal dielectric layer on a semiconductor substrate and then forming a hard mask layer on the inter-metal dielectric layer. The hard mask layer includes separately photolithographically-defined trench and via patterns of unequal depths therein. The hard mask layer may also include a mask rework layer that contacts an upper surface of the inter-metal dielectric layer. The inter-metal dielectric layer may be selectively etched to reflect the shape of the via pattern therein, using the hard mask layer as an etching mask. Then, the hard mask layer may be further etched and modified to increase a depth of the trench pattern therein, using the mask rework layer as an etch-stop layer. The inter-metal dielectric layer is then selectively etched again to reflect the shape of the trench pattern therein and define a via that extends through the inter-metal dielectric layer. This etching step is also performed using the modified hard mask layer as an etching mask.

According to these embodiments of the present invention, the step of forming a inter-metal dielectric layer may be preceded by the steps of forming an under-metal dielectric layer having a first wiring pattern therein, on the semiconductor substrate, and then forming a first etch-stop layer (e.g., SiCN, SiOC and/or SiON layer) on the under-metal dielectric layer. The step of forming the hard mask layer may also include forming the mask rework layer as a first oxide layer, on the inter-metal dielectric layer and then forming a first mask dielectric layer including SiCN, SiOC and/or SiON, on the mask rework layer. A second oxide layer is then formed on the first mask dielectric layer. This step is followed by forming a second mask dielectric layer, including SiCN, SiOC and/or SiON, on the second oxide layer and then forming a third oxide layer on the second mask dielectric layer.

According to additional aspects of these embodiments of the invention, the step of forming the third oxide layer may be followed by the steps of selectively etching the third oxide layer to define the trench pattern in the hard mask layer, using a first photoresist mask as an etching mask, and then selectively etching the second mask dielectric layer and the second oxide layer in sequence to define the via pattern therein, using a second photoresist mask as an etching mask. The second mask dielectric layer and the first mask dielectric layer are then selectively etched to increase the depths of the trench and via patterns within the hard mask layer.

In addition, the step of etching the hard mask layer to increase a depth of the trench pattern therein may include selectively etching the first and second mask dielectric layers using at least the first oxide layer as etch stop layer. The step of selectively etching the inter-metal dielectric layer to reflect the shape of the trench pattern therein and define a via that extends through the inter-metal dielectric layer may also be followed by a step of selectively etching the first etch-stop layer and the first mask dielectric layer for a sufficient duration to expose an upper surface of the first wiring pattern. The via may then be filled with an electrically conductive material, such as copper.

Alternatively, the step of forming the third oxide layer may be followed by the steps of selectively etching the third oxide layer, the second mask dielectric layer and the second oxide layer in sequence to define the via pattern in the hard mask layer, using a first photoresist mask as an etching mask, and then selectively etching the third oxide layer to define the trench pattern therein, using a second photoresist mask as an etching mask. The second mask dielectric layer and the first mask dielectric layer are then further etched to increase the depths of the trench and via patterns in the hard mask layer. The step of etching the hard mask layer to increase a depth of the trench pattern therein may also include selectively etching the first and second mask dielectric layers using the first and second oxide layers as etch stop layers.

DETAILED DESCRIPTION OF PREFERRED EMBODIMENTS

Figure 1A:
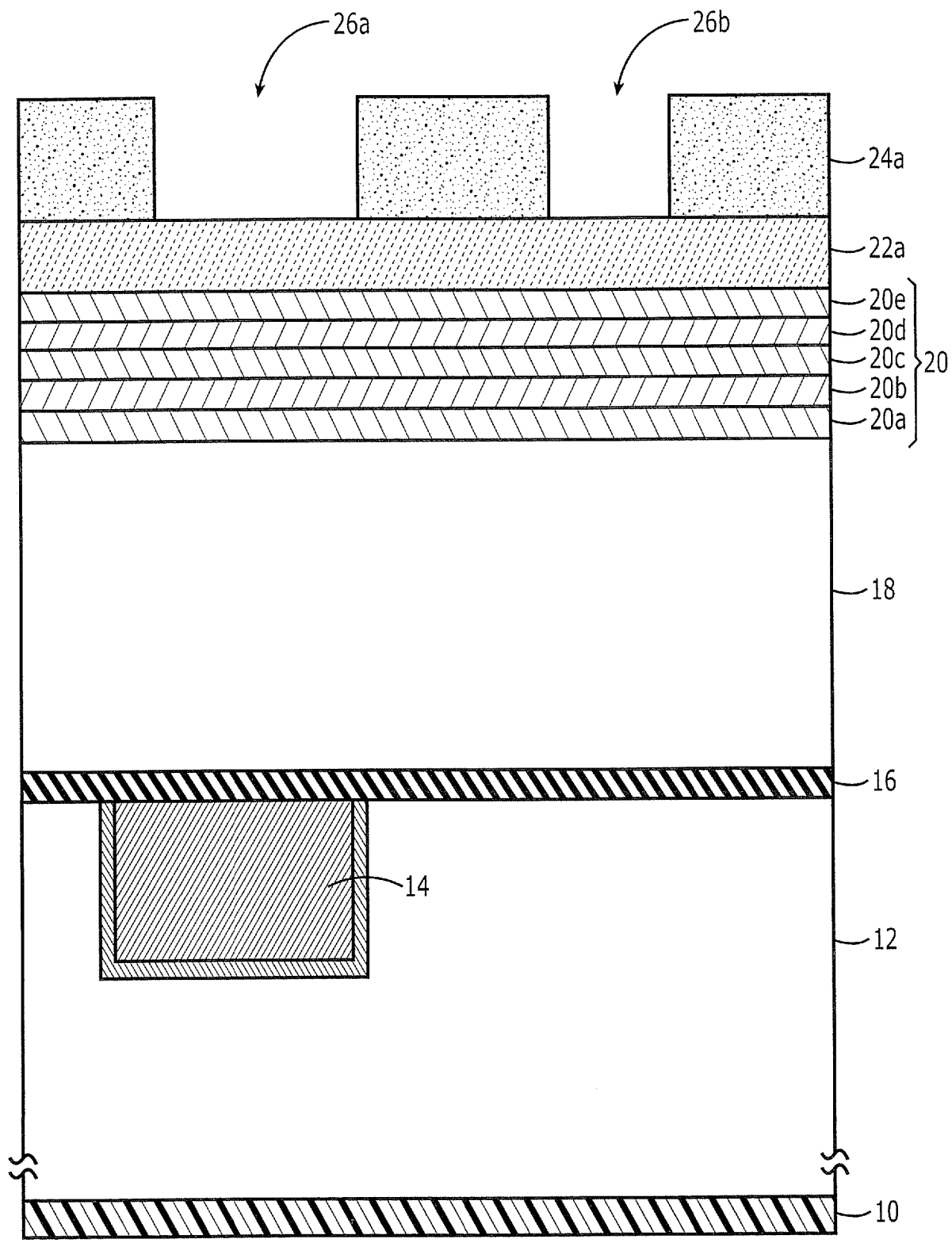
FIGS. 1A-1I are cross-sectional views of intermediate structures that illustrate methods of forming metal interconnect structures according to embodiments of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

FIGS. 1A-1I illustrate methods forming dual-damascene metal interconnect structures according to some embodiments of the present invention. According to these methods, an under-metal dielectric layer 12 having a damascene wiring pattern 14 therein is provided on a substrate 10 (e.g., semiconductor substrate). This damascene wiring pattern 14 may be a copper wiring pattern that is formed in a recess in the under-metal dielectric layer 12. A copper barrier layer (e.g., TaN layer) may be provided to line a bottom and sidewalls of the recess and inhibit out-diffusion of copper from the copper wiring pattern 14 to the under-metal dielectric layer 12.

A first etch-stop layer 16 is formed on the under-metal dielectric layer 12, as illustrated. This first etch-stop layer 16 may be formed as a SiCN, SiC and/or SiN layer having a thickness in a range from about 200 Å to about 300 Å, for example. An electrically insulating layer 18, which may operate as an inter-metal dielectric layer, is formed on the first etch-stop layer 16. The electrically insulating layer 18 may be formed from a dielectric material having an ultra-low dielectric constant (ULK), such as a SiCOH layer having a dielectric constant in a range from about 2.2 to about 2.4.

A hard mask layer 20 is formed on the electrically insulating layer 18. As illustrated, this hard mask layer 20 may include a stacked composite of at least four electrically insulating material layers. In particular, the hard mask layer 20 may include a composite of a first oxide layer 20a which may be utilized as a mask rework layer, a first mask dielectric layer 20b, a second oxide layer 20c, a second mask dielectric layer 20d and a third oxide layer 20e. In some of these embodiments of the invention, the first, second and third oxide layers 20a, 20c and 20e may be formed as an undoped or fluorine-doped TEOS (tetraethyl orthosilicate glass) layer, for example. The first and second mask dielectric layers 20b and 20d may also be formed using dielectric materials having relatively high dielectric constants compared to the electrically insulating layer 18. In particular, the first and second mask dielectric layers 20b and 20d may be formed of materials such as SiCN, SiOC, SiON, SiOCN, SiC and/or SiN, for example.

Figure 1B:
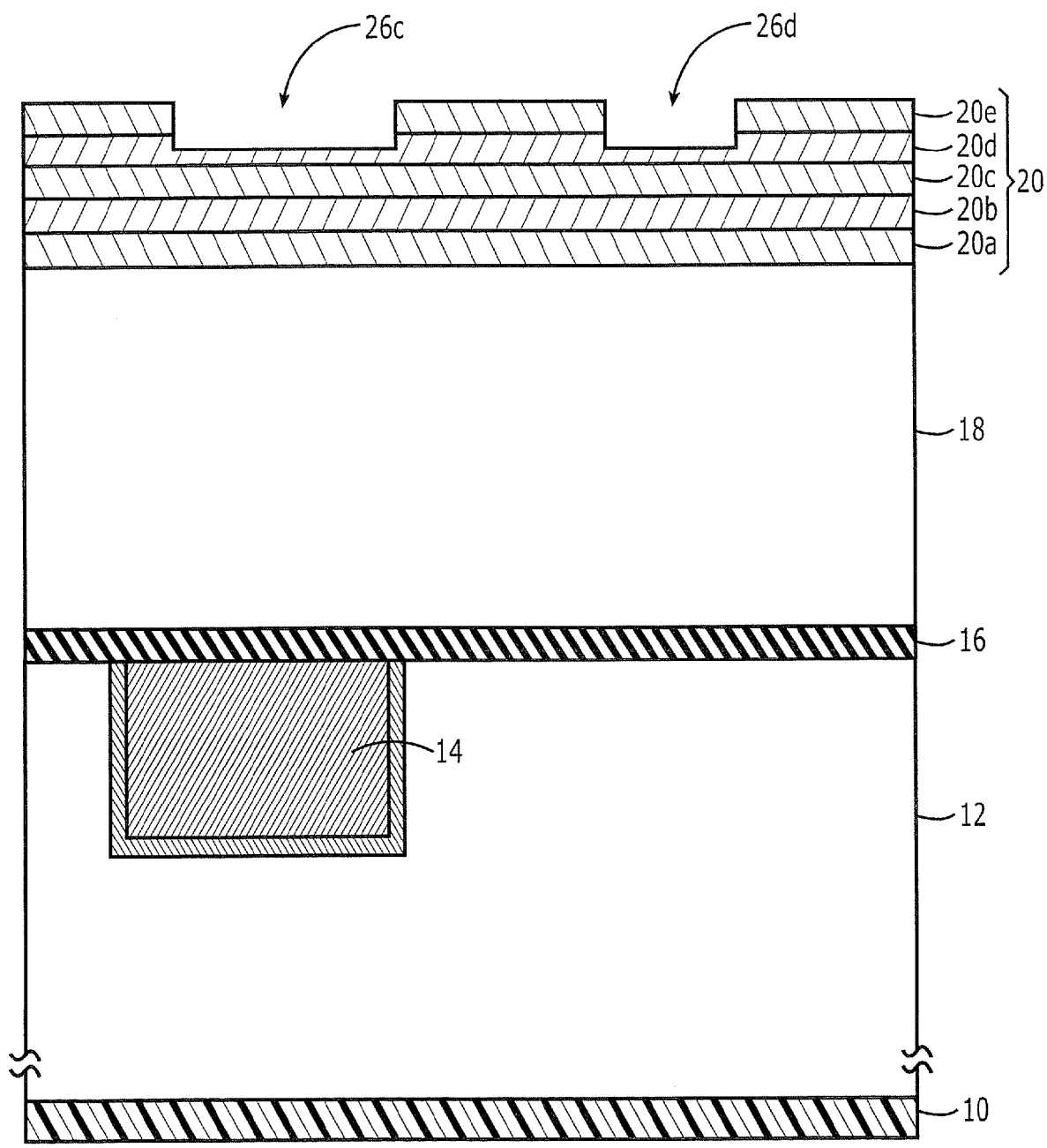

Following formation of the hard mask layer 20, a bottom anti-reflective coating 22a (BARC) is formed on the hard mask layer 20 and a photoresist layer 24a is formed on the hard mask layer 20. This photoresist layer 24a is photolithographically patterned to define first and second openings 26a and 26b therein, which expose the anti-reflective coating 22a. As illustrated by FIG. 1B, an etching step (e.g., reactive-ion etching) is performed to selectively etch through the third oxide layer 20e, using the second mask dielectric layer 20d as an etch-stop layer. This etching step will also result in the formation of openings 26c and 26d within the hard mask 20, which are self-aligned to the first and second openings 26a and 26b. These openings 26c and 26d may represent spaced-apart trenches within the hard mask layer 20. The anti-reflective coating 22a and photoresist layer 24a are then removed from the substrate using stripping techniques (e.g., ash stripping).

Figure 1C:
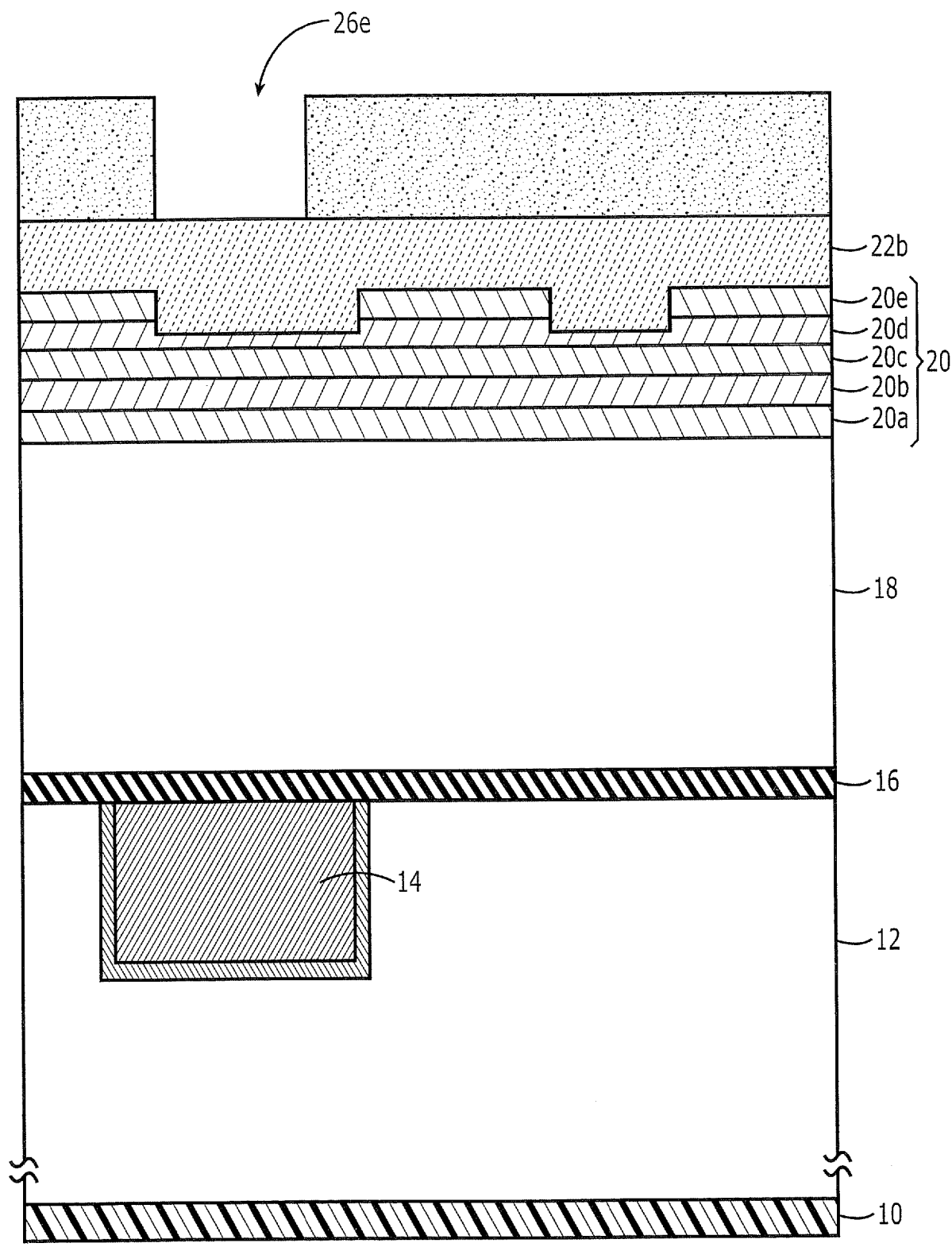
Figure 1D:
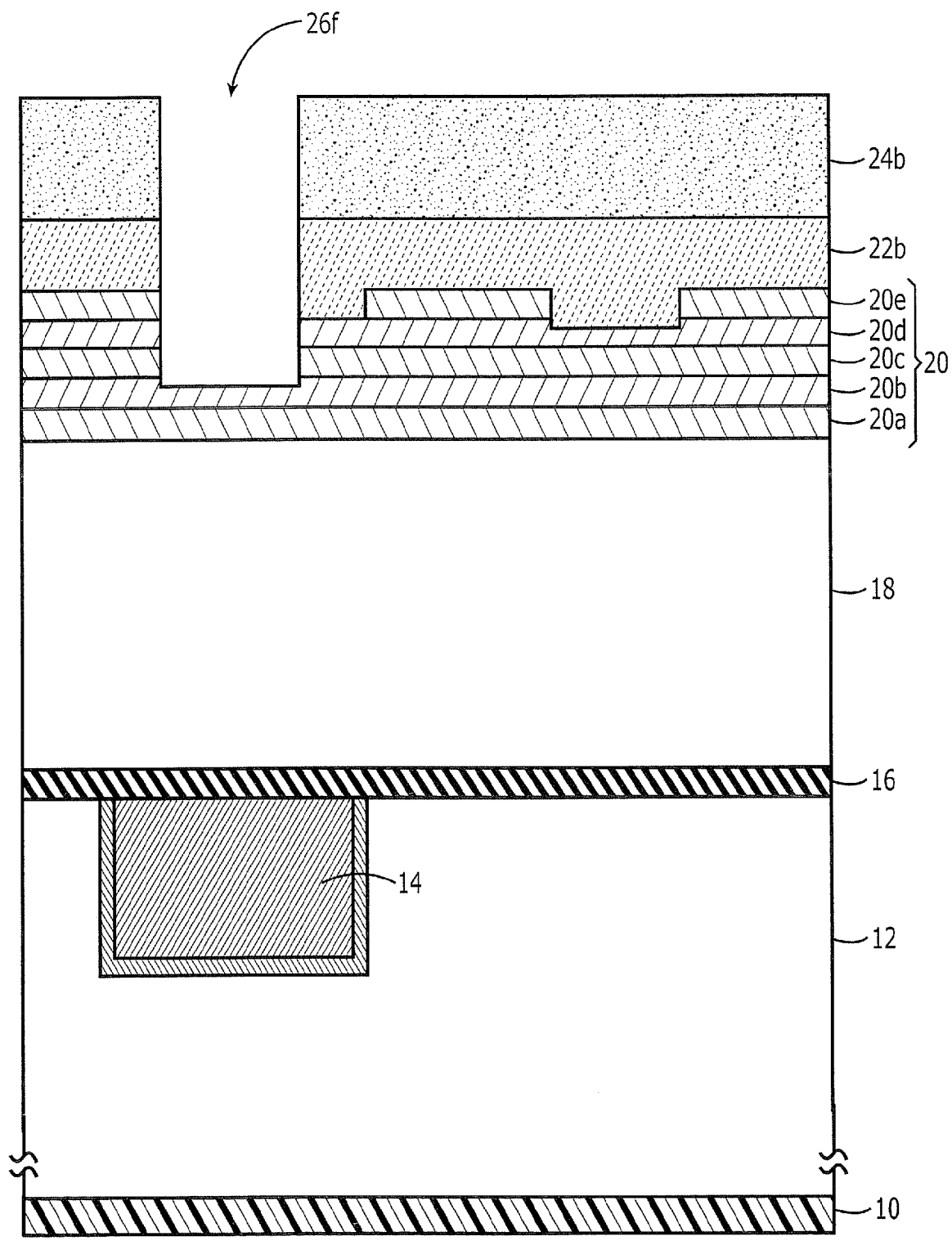

Thereafter, as illustrated by FIG. 1C, another bottom anti-reflective coating 22b and photoresist layer 24b are formed on the hard mask layer 20. The photoresist layer 24b is then photolithographically patterned to define an opening 26e therein, which extends opposite the trench 26c within the hard mask 20. A selective etching step(s) is then performed to etch through the anti-reflective coating 22b, the second mask dielectric layer 20d and the second oxide layer 20c in sequence, using the first mask dielectric layer 20b as an etch stop layer. This sequential etching step results in the formation of an opening 26f, as illustrated by FIG. 1D.

Figure 1E:
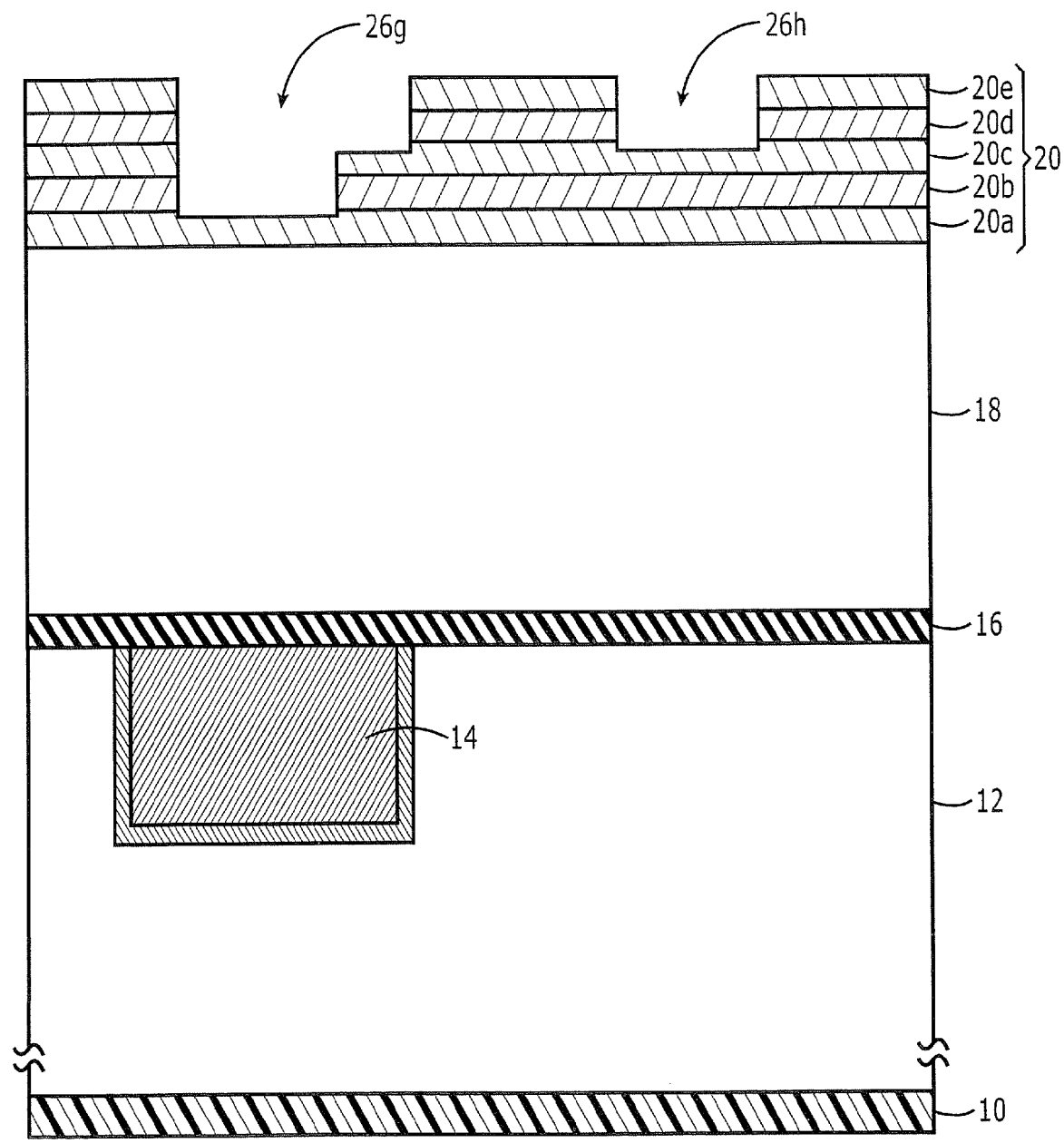
Figure 1F:
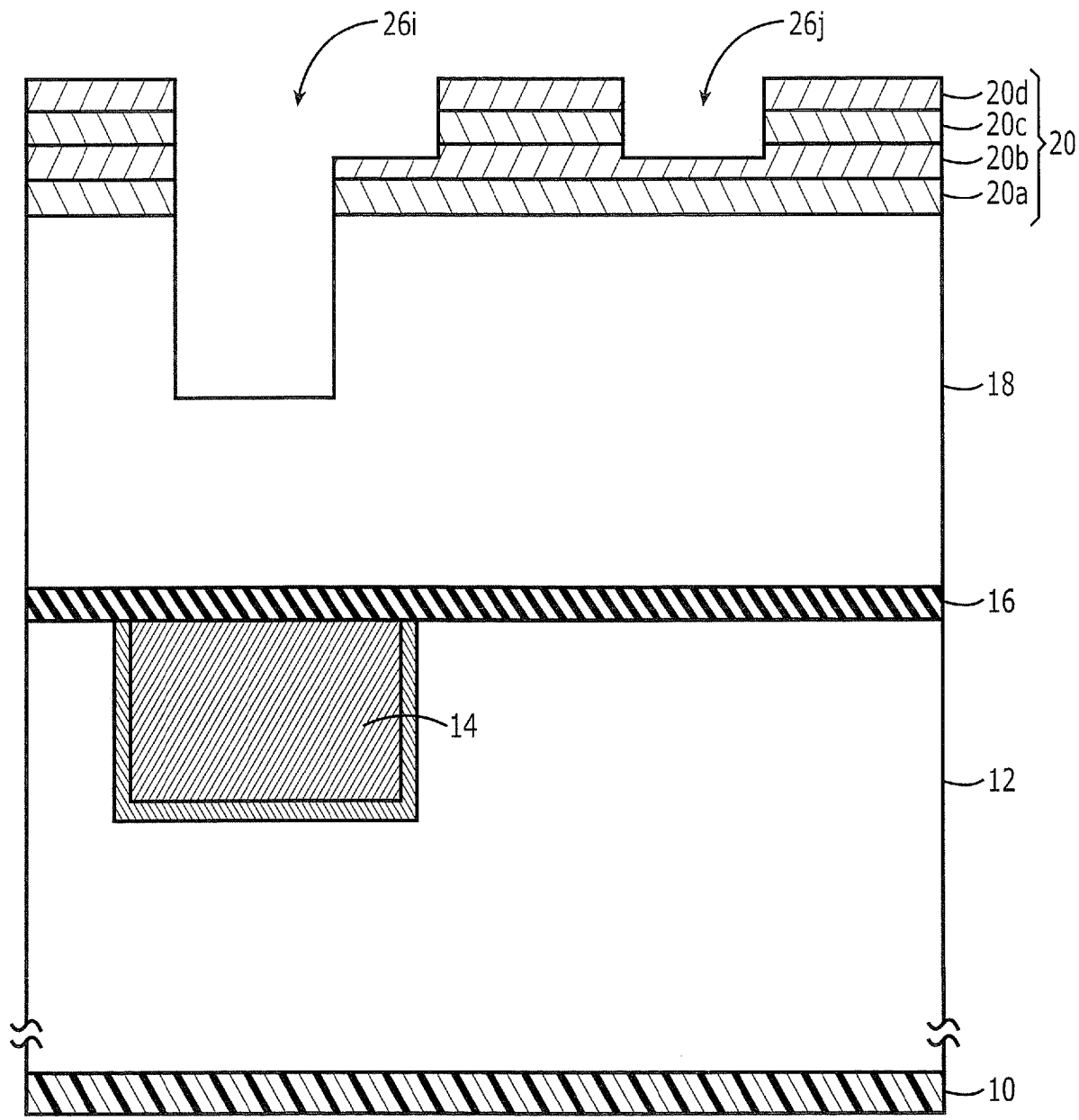
Figure 1G:
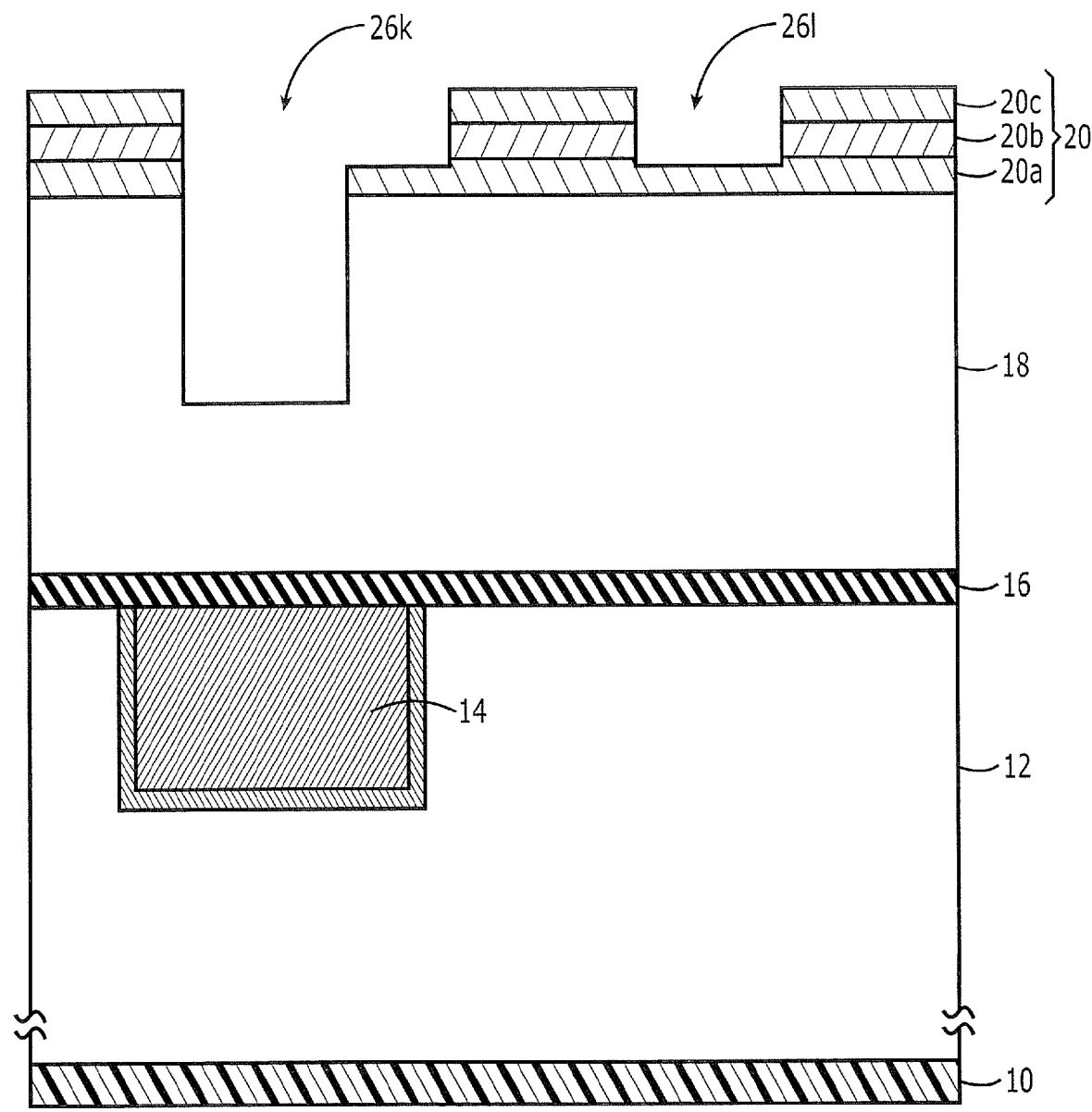

The bottom anti-reflective coating 22b and the photoresist layer 24b are then removed using a strip plasma process, for example. The second and third oxide layers 20c and 20e are then used as a mask during a step to selectively etch through the first and second mask dielectric layers 20b and 20d to define openings 26g and 26h. During this etching step, the first and second oxide layers 20a and 20c may be used as an etch stop, as illustrated by FIG. 1E. Referring now to FIG. 1F, a selective etching step (e.g., RIE etching) is performed to define a partial via opening in the electrically insulating layer 18. During this etching step, the third oxide layer 20e and portions of the first and second oxide layers 20a and 20c exposed by the openings 26g and 26h are removed and the first mask dielectric layer 20b is used as an etch stop. This selective etching step results in the formation of a partial via opening 26i, which extends into the electrically insulating layer 18, and a trench 26j, which extends within the hard mask 20. The hard mask is then further defined by performing a highly selective etching step that removes the second mask dielectric layer 20d and removes exposed portions of the first mask dielectric layer 20b, as illustrated by FIG. 1G. This selective etching step results in the formation of a partial via opening 26k within the electrically insulating layer 18 and a trench 26l within the hard mask 20.

Figure 1H:
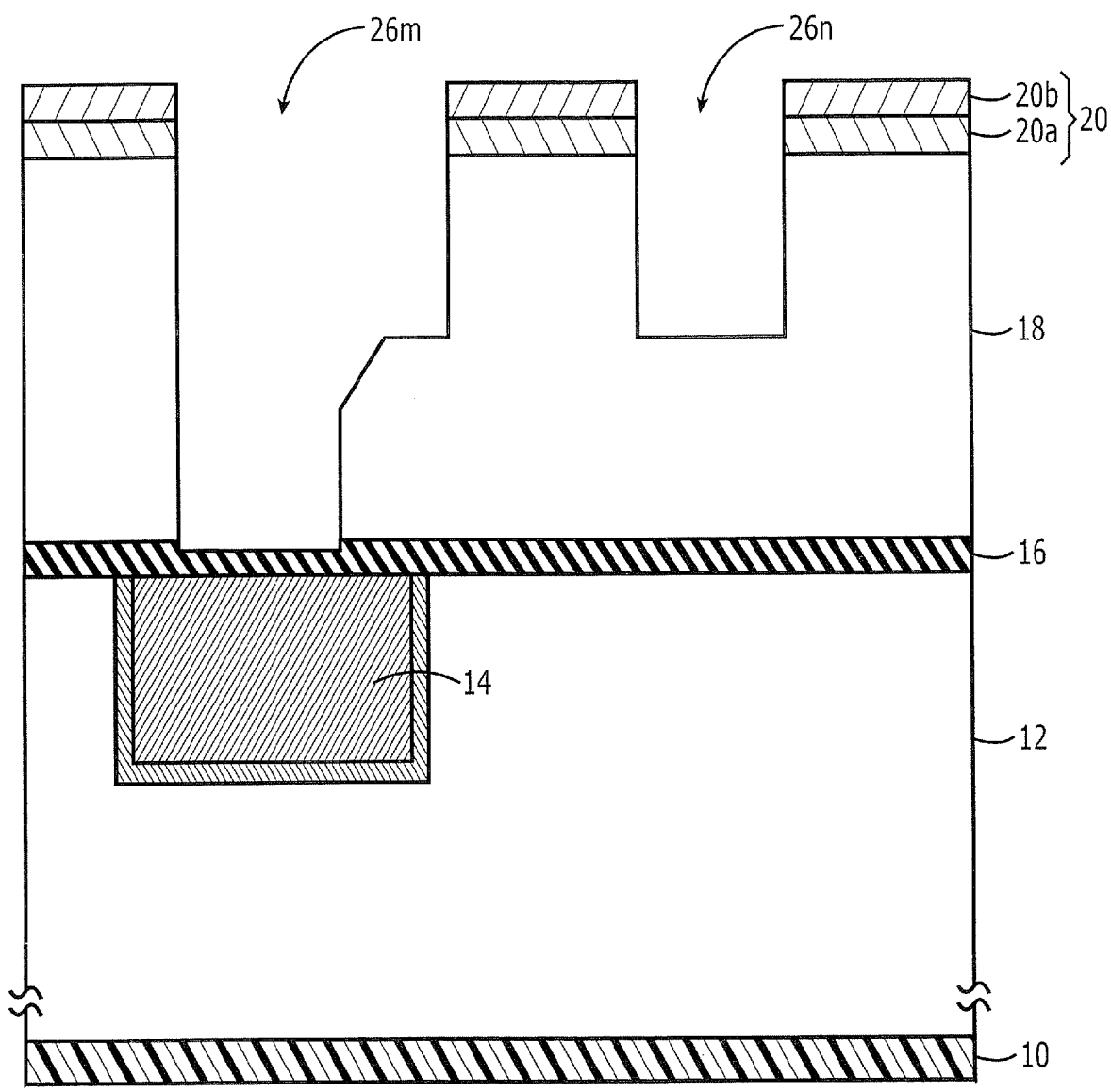
Figure 1I:
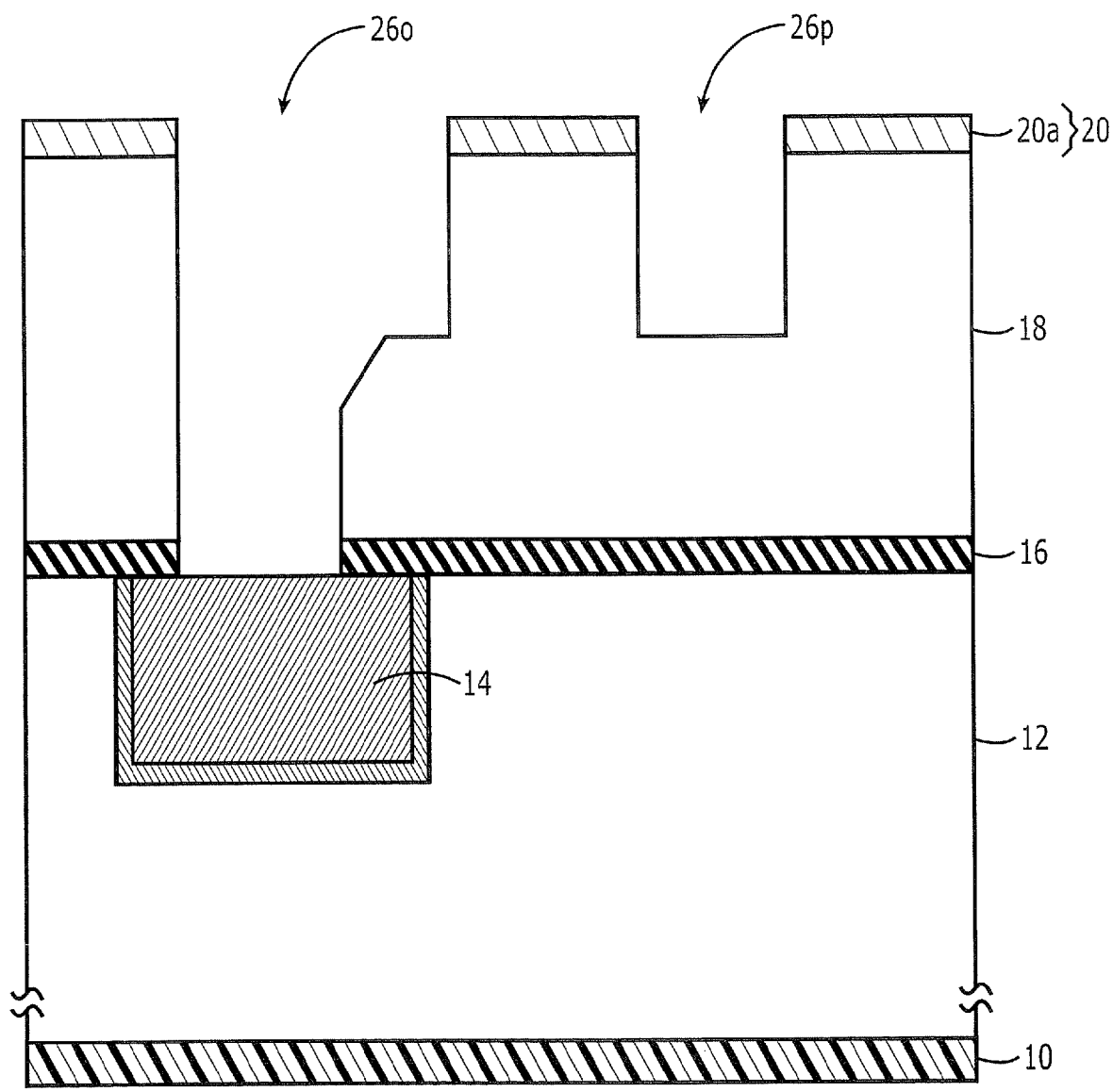

As illustrated by FIG. 1H, another selective etching step is further performed to remove the second oxide layer 20c and portions of the first oxide layer 20a that are exposed by the openings in the first mask dielectric layer 20b. This selective etching step is also performed for a sufficient duration to define a via 26m and a trench 26n within the electrically insulating layer 18. The via 26m extends entirely through the electrically insulating layer 18 and exposes a portion of the first etch-stop layer 16 extending opposite the copper wiring pattern 14. Finally, as illustrated by FIG. 1I, another selective etching step is performed to remove the first mask dielectric layer 20b and etch through the exposed portion of the first etch-stop layer 16 to thereby reveal the copper wiring pattern 14 within the via 26o. Metal damascene techniques may then be performed to fill the via 26o and trench 26p with electrically conductive materials.

FIGS. 2A-2J illustrate methods forming dual-damascene metal interconnect structures according to further embodiments of the present invention. According to these methods, an under-metal dielectric layer 12 having a damascene wiring pattern 14 therein is provided on a substrate 10 (e.g., semiconductor substrate). This damascene wiring pattern 14 may be a copper wiring pattern that is formed in a recess in the under-metal dielectric layer 12. A copper barrier layer (e.g., TaN layer) may be provided to line a bottom and sidewalls of the recess and inhibit out-diffusion of copper from the copper wiring pattern 14. A first etch-stop layer 16 is formed on the under-metal dielectric layer 12, as illustrated. This first etch-stop layer 16 may be formed as a SiCN, SiC and/or SiN layer having a thickness in a range from about 200 Å to about 300 Å, for example. An electrically insulating layer 18, which may operate as an inter-metal dielectric layer, is formed on the first etch-stop layer 16. The electrically insulating layer 18 may be formed from a dielectric material having an ultra-low dielectric constant (ULK), such as a SiCOH layer having a dielectric constant in a range from about 2.2 to about 2.4.

A hard mask layer 20 is formed on the electrically insulating layer 18. As illustrated, this hard mask layer 20 may include a stacked composite of at least four electrically insulating material layers. In particular, the hard mask layer 20 may include a composite of a first oxide layer 20a which may be utilized as a mask rework layer, a first mask dielectric layer 20b, a second oxide layer 20c, a second mask dielectric layer 20d and a third oxide layer 20e. In some of these embodiments of the invention, the first, second and third oxide layers 20a, 20c and 20e may be formed as an undoped or fluorine-doped TEOS (tetraethyl orthosilicate glass) layer, for example. The first and second mask dielectric layers 20b and 20d may also be formed using dielectric materials having relatively high dielectric constants compared to the electrically insulating layer 18. In particular, the first and second mask dielectric layers 20b and 20d may be formed of materials such as SiCN, SiOC, SiON, SiOCN, SiC and/or SiN, for example.

Figure 2A:
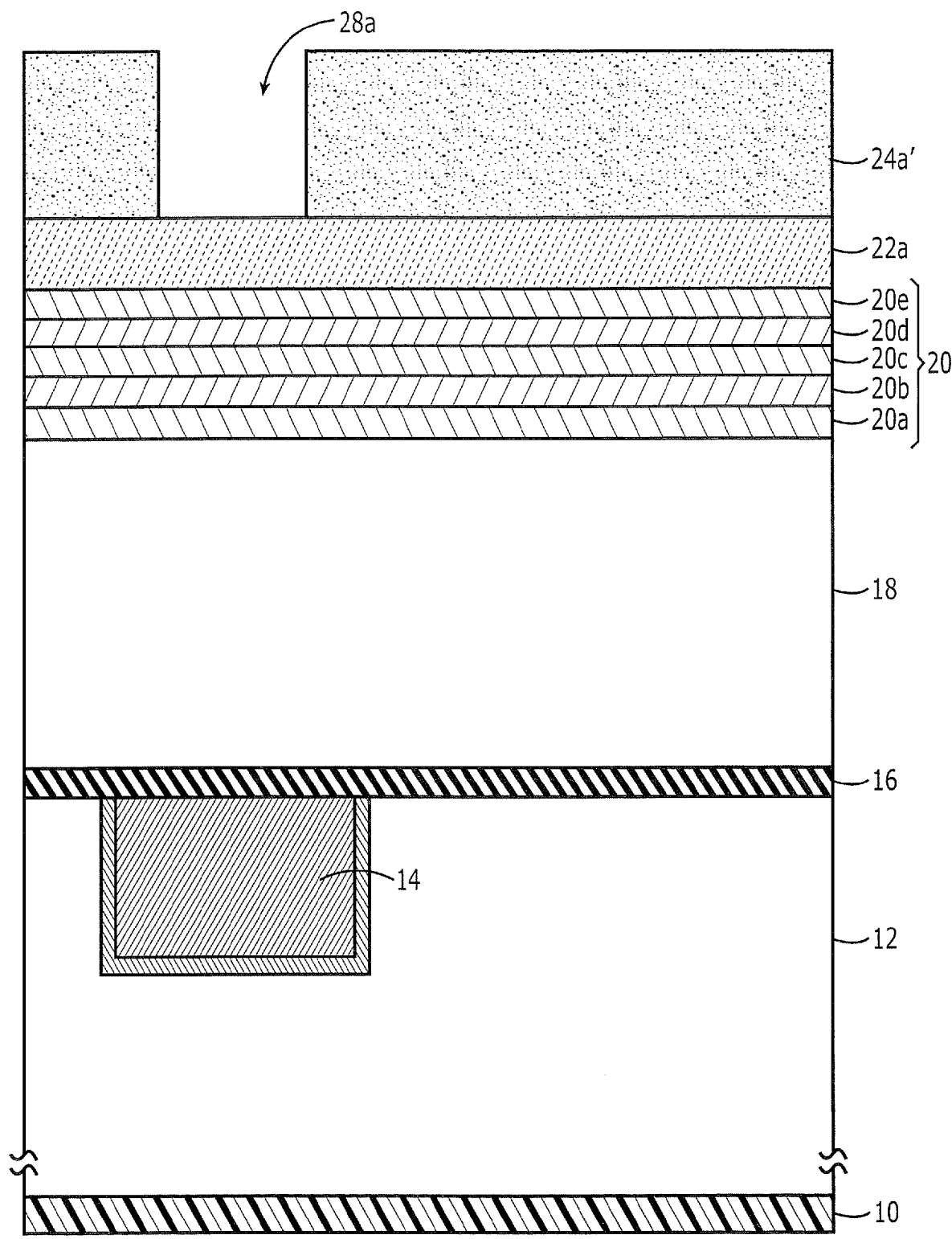
FIGS. 2A-2J are cross-sectional views of intermediate structures that illustrate methods of forming metal interconnect structures according to embodiments of the present invention.
Figure 2B:
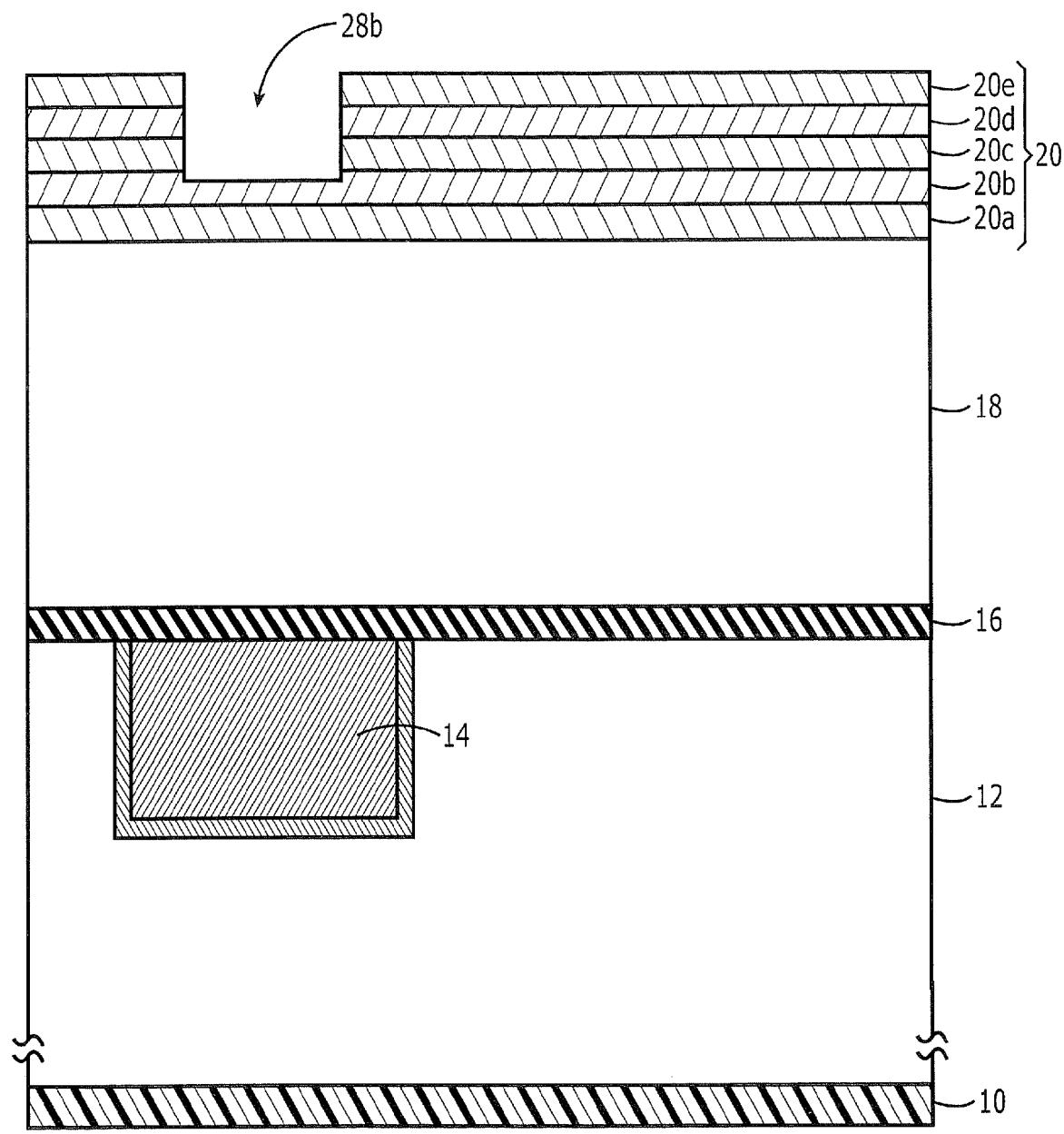

Following formation of the hard mask layer 20, a bottom anti-reflective coating 22a (BARC) is formed on the hard mask layer 20 and a photoresist layer 24a' is formed on the hard mask layer 20. This photoresist layer 24a' is photolithographically patterned to define a first opening 28a therein, which exposes the anti-reflective coating 22a. As illustrated by FIG. 2B, a sequence of etching steps are performed to selectively etch through the third oxide layer 20e, the second mask dielectric layer 20d and the second oxide layer 20c, using the first mask dielectric layer 20b as an etch-stop layer. This sequence of etching steps will also result in the formation of an opening 28b within the hard mask 20. The anti-reflective coating 22a and photoresist layer 24a' are then removed from the substrate using stripping techniques (e.g., ash stripping).

Figure 2C:
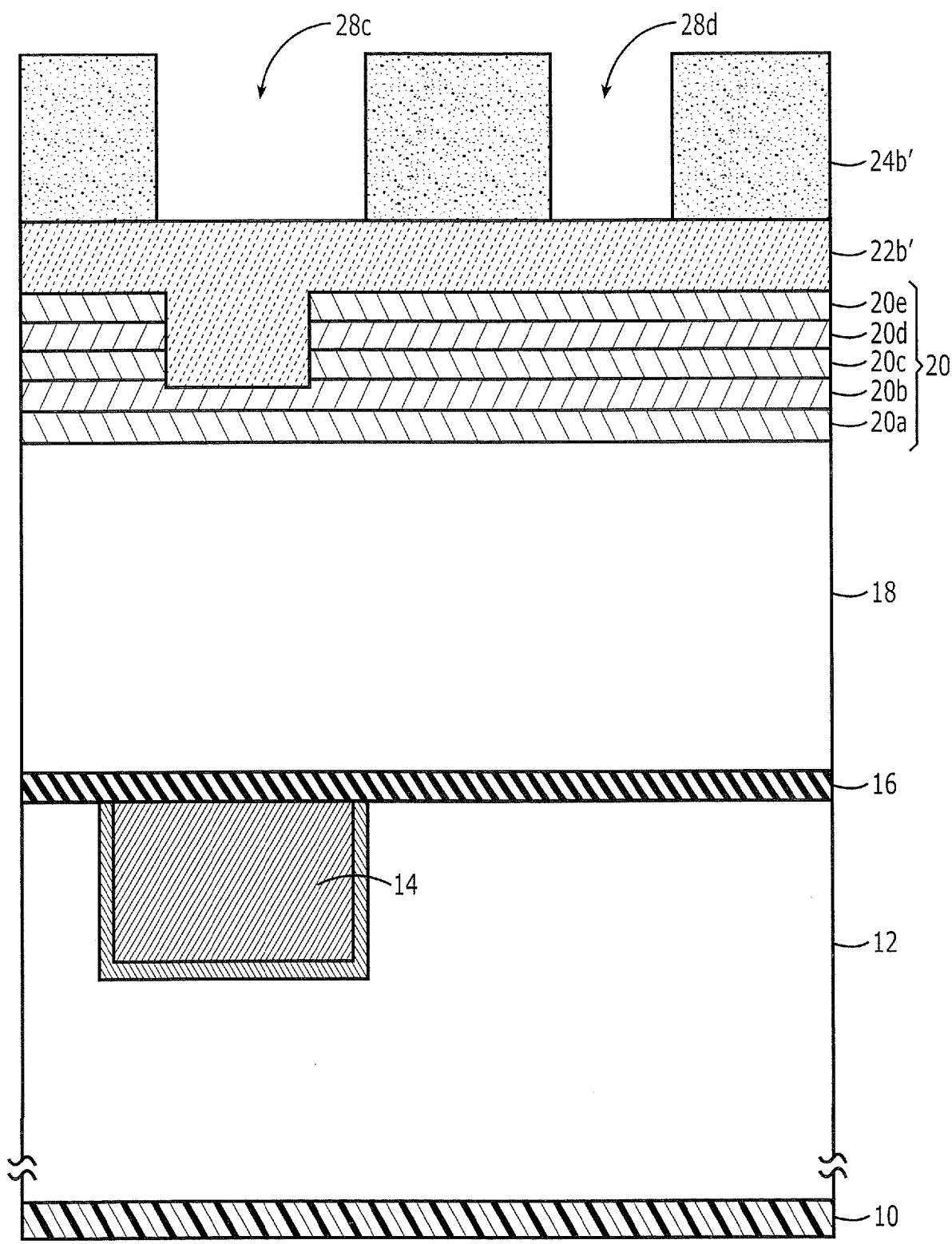
Figure 2D:
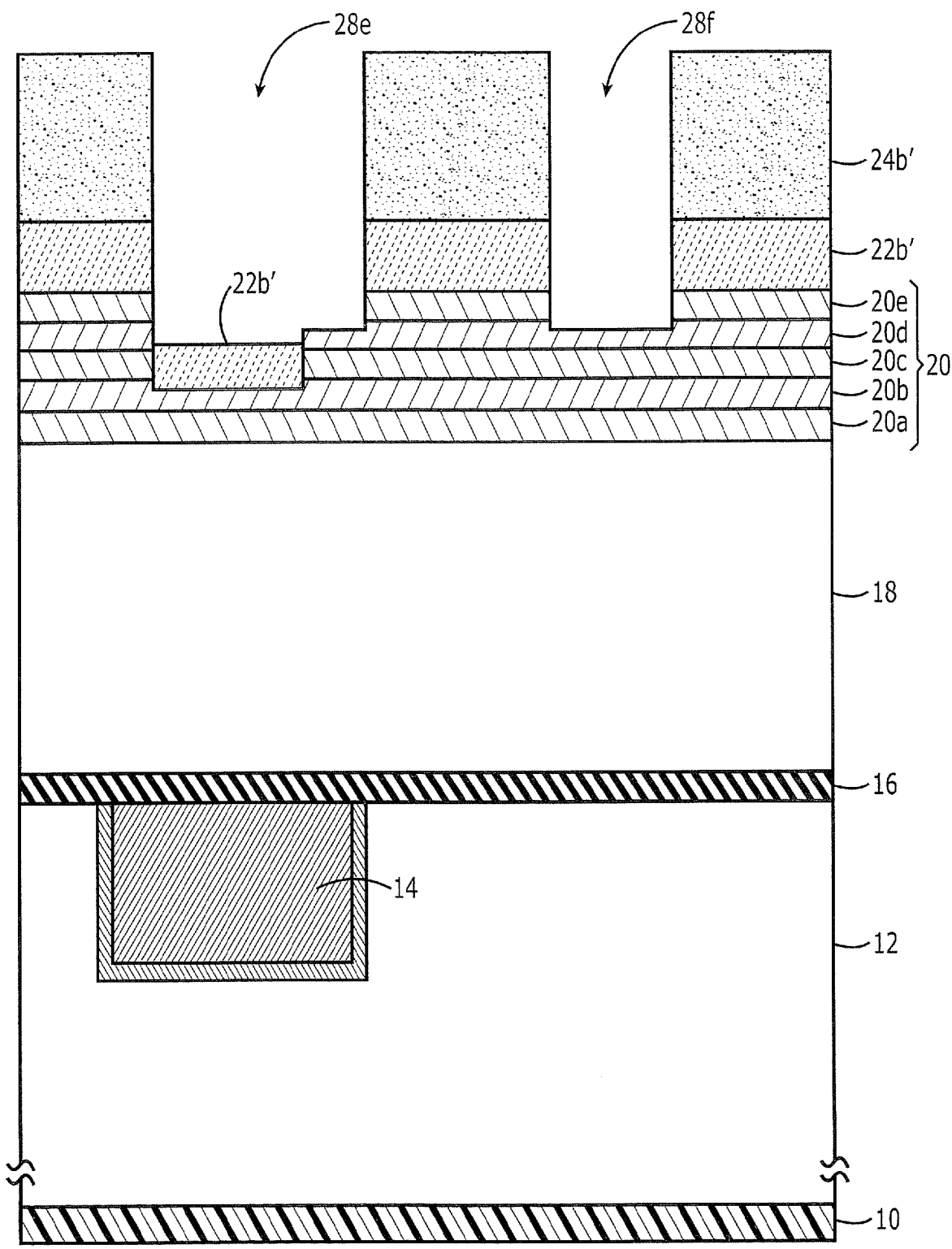

Thereafter, as illustrated by FIG. 2C, another bottom anti-reflective coating 22b' and photoresist layer 24b' are formed on the hard mask layer 20. The photoresist layer 24b' is then photolithographically patterned to define a pair of openings 28c and 28d therein. A selective etching step(s) is then performed to etch through the anti-reflective coating 22b' and the third oxide layer 20e, using the second mask dielectric layer 20d as an etch stop layer. This etching step results in the formation of openings 28e and 28f within the photoresist layer 24b', the bottom anti-reflective coating 22b' and the third oxide layer 20e, as illustrated by FIG. 2D.

Figure 2E:
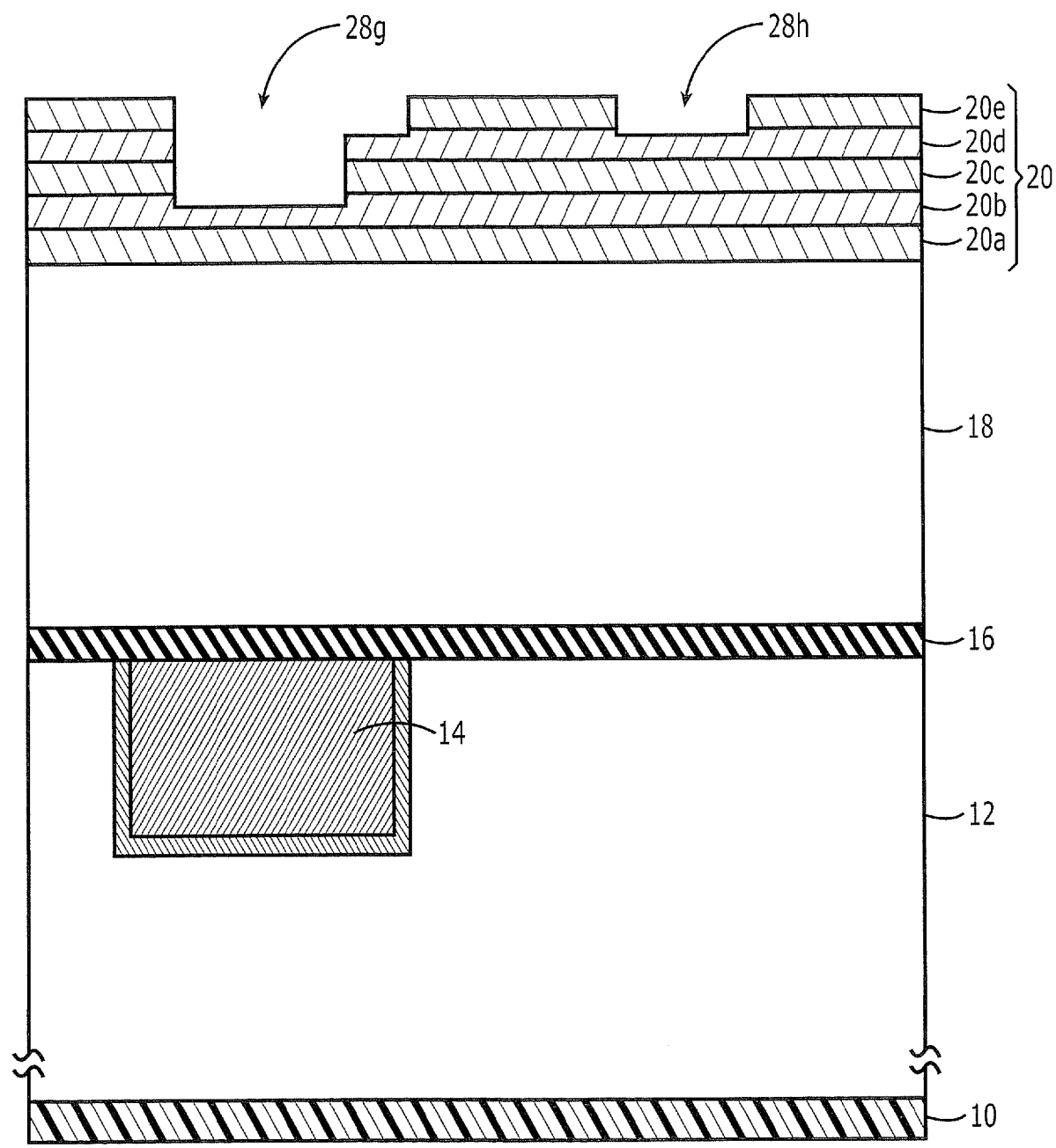
Figure 2F:
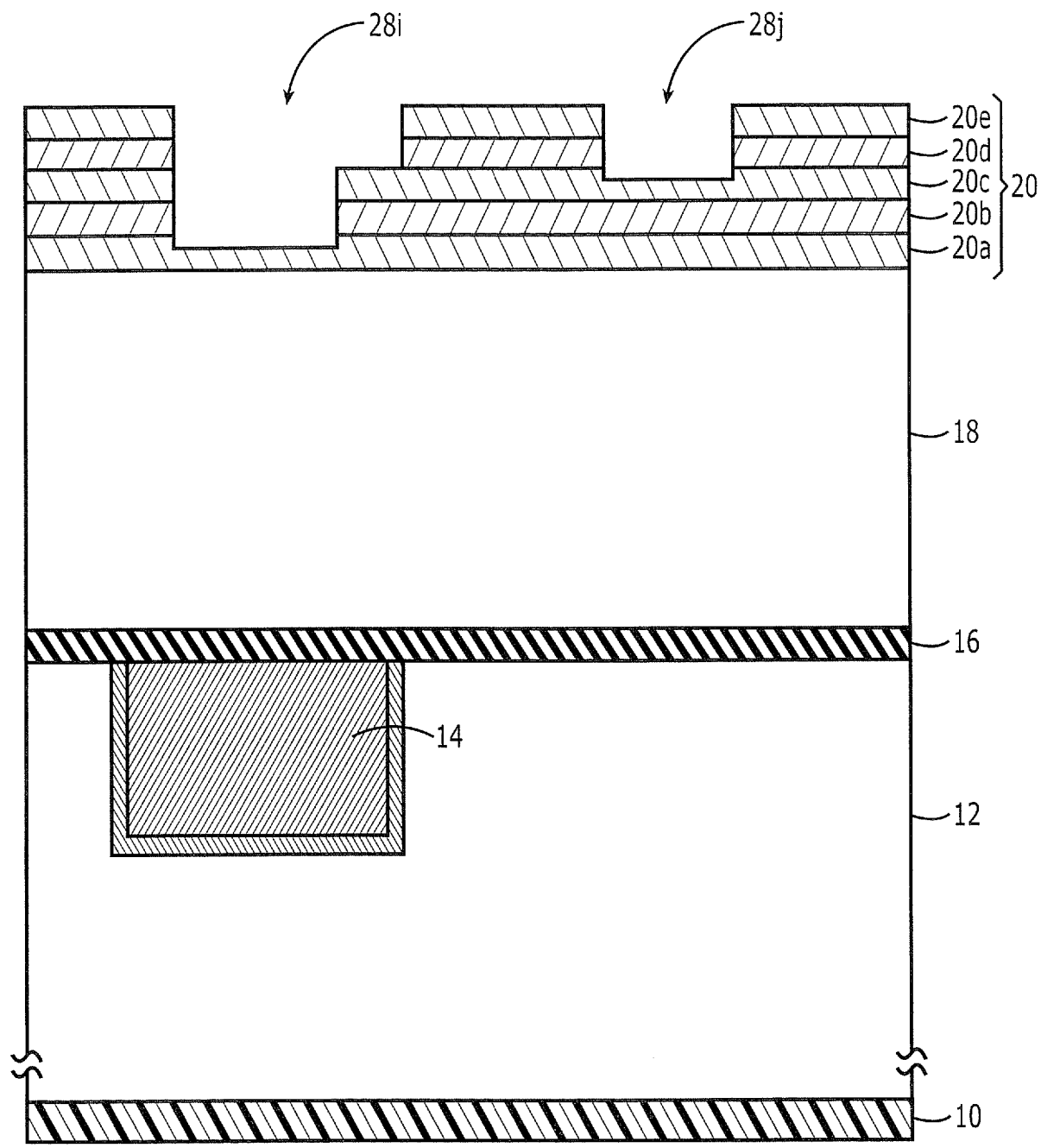

Referring now to FIG. 2E, the photoresist layer 24b' and the bottom anti-reflective coating 22b' are then removed to yield openings 28g and 28h in the hard mask 20. As illustrated, the opening 28g exposes the first mask dielectric layer 20b and the opening 28h exposes the second mask dielectric layer 20d. Then, as illustrated by FIG. 2F, an additional etching step is performed to selectively remove exposed portions of the first mask dielectric layer 20b and the second mask dielectric layer 20d, using the first oxide layer 20a and second oxide layer 20c as an etch stop. This etching step results in the formation of openings 28i and 28j in the hard mask 20.

Figure 2G:
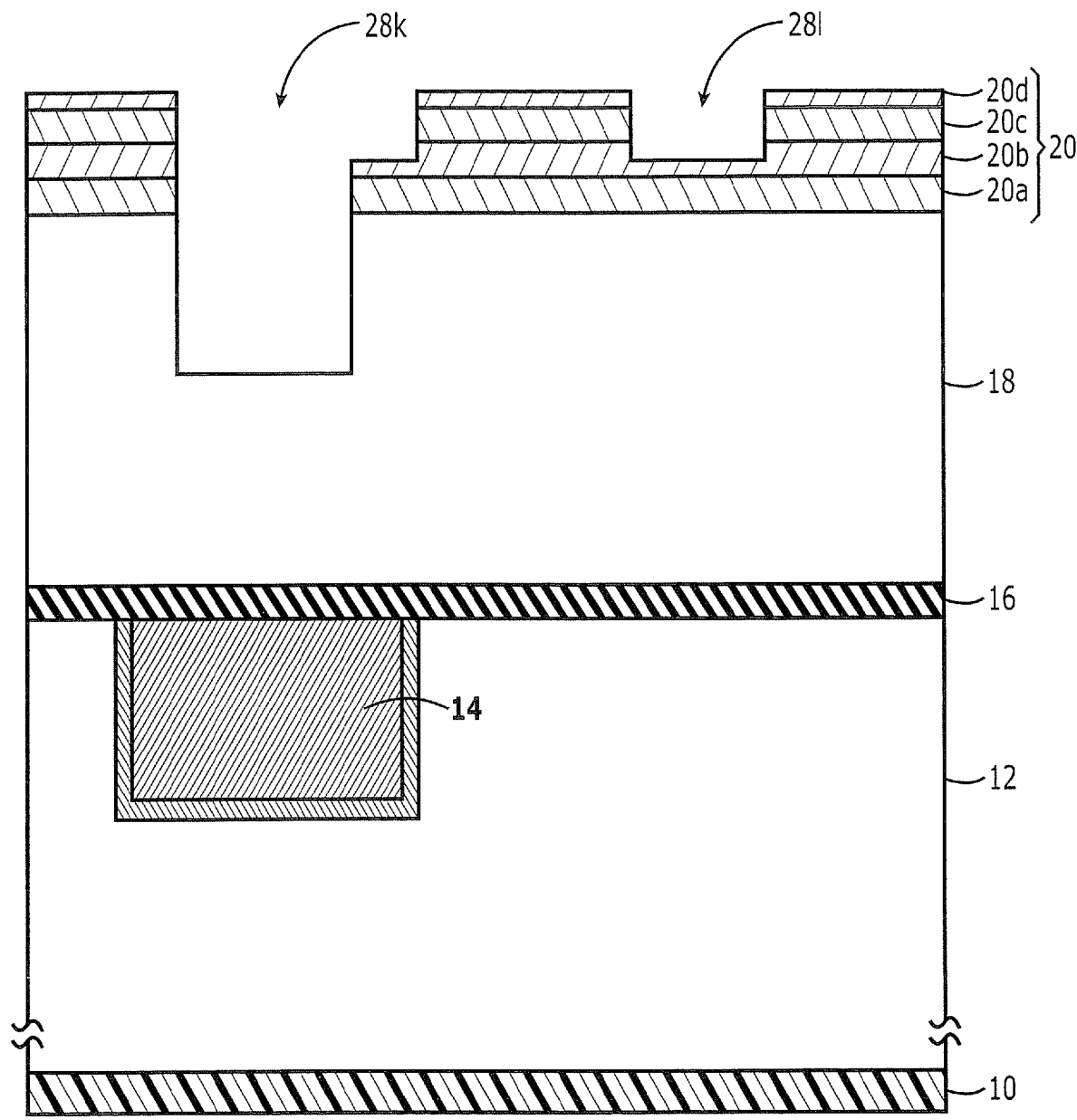
Figure 2H:
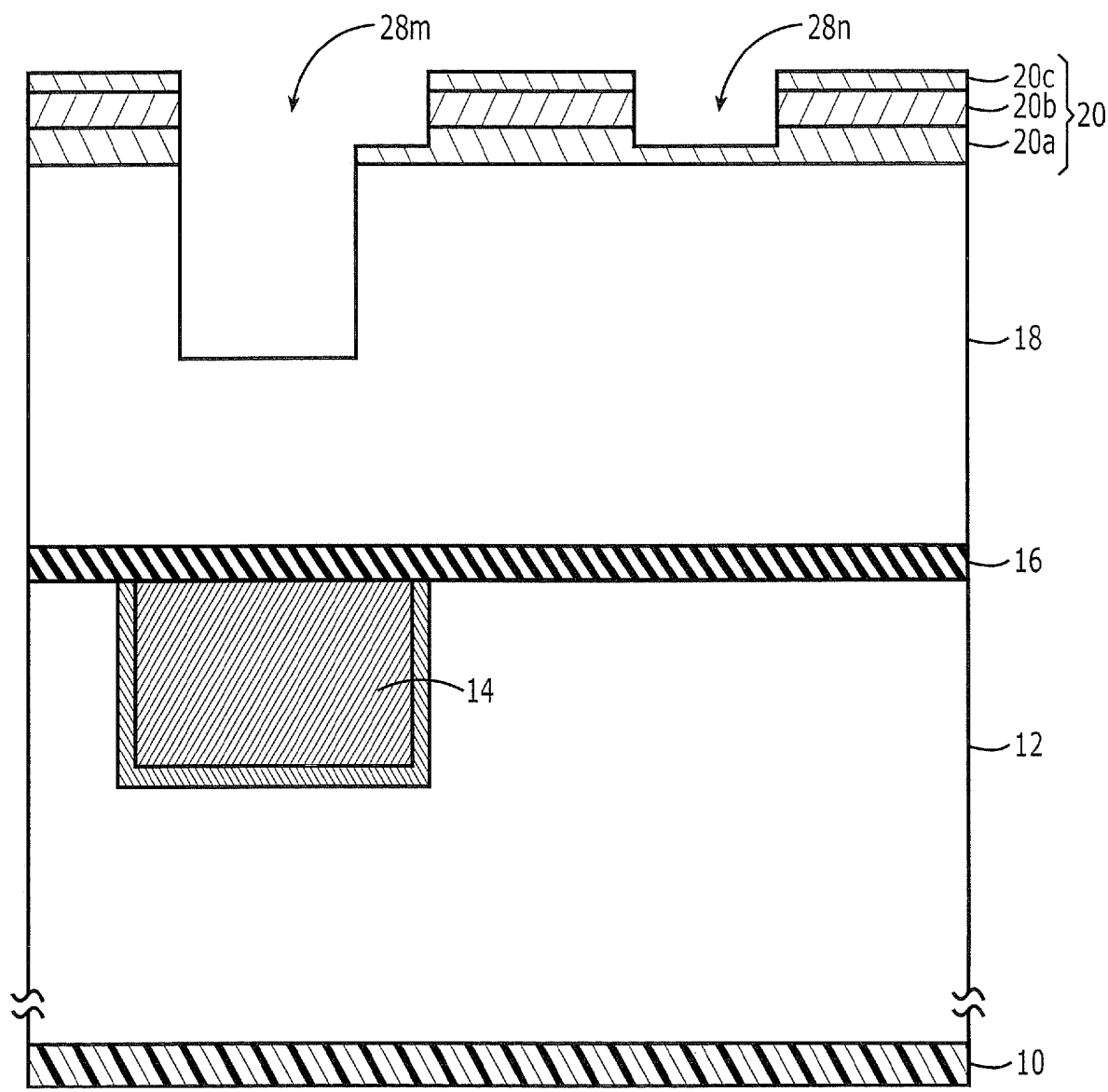
Figure 2I:
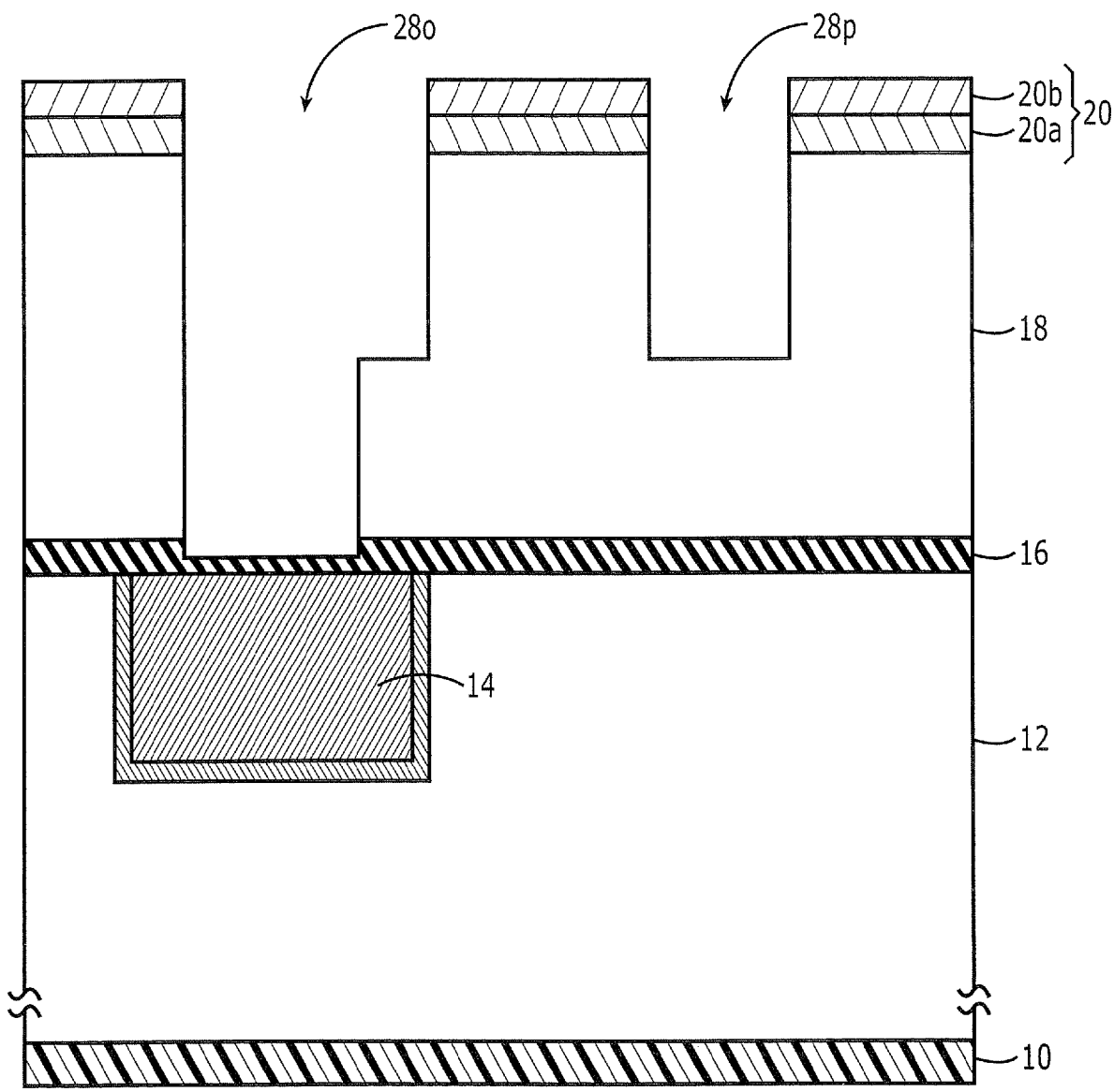
Figure 2J:
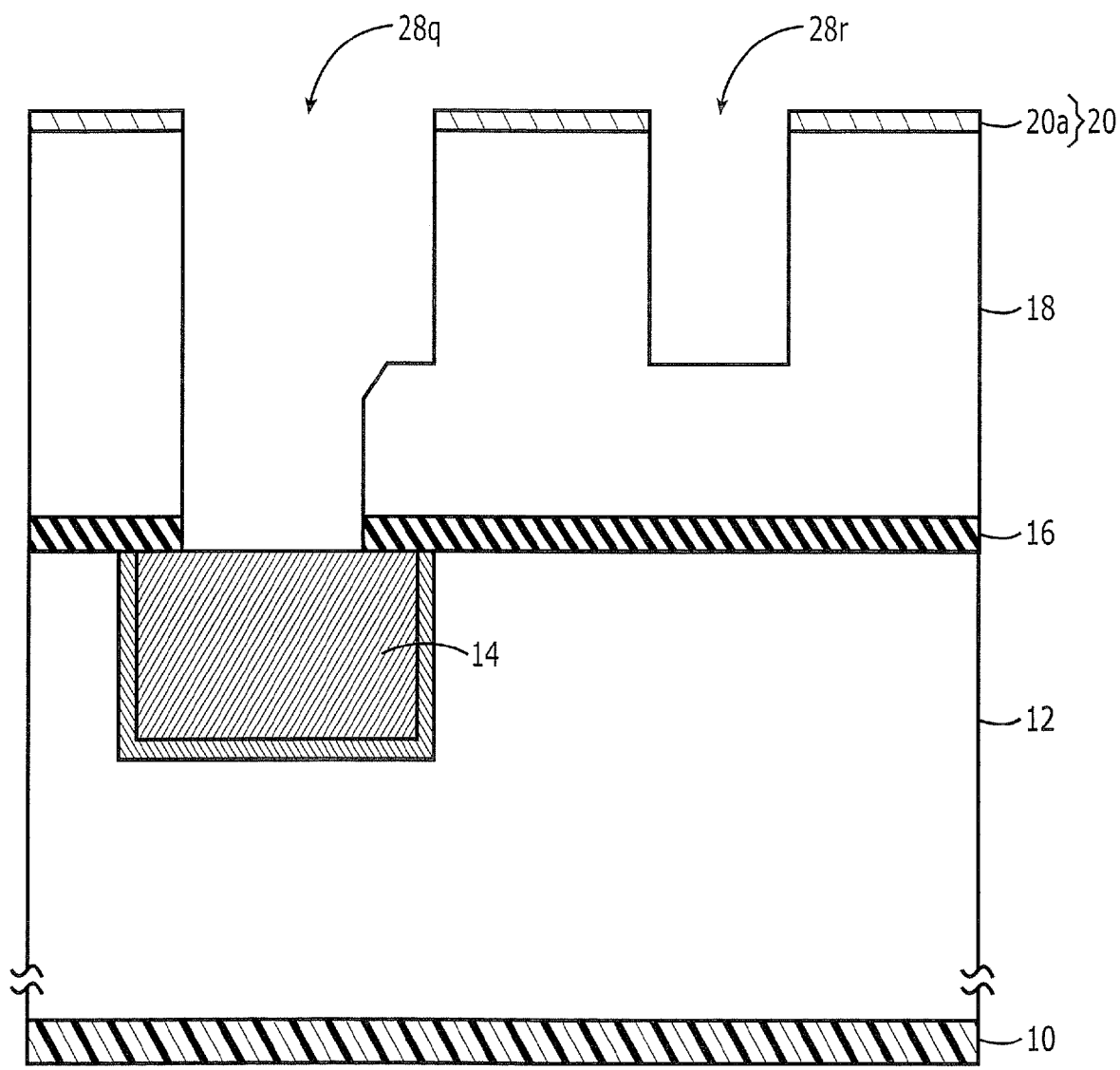

Referring now to FIG. 2G, an additional etching step, such as one that is selective to oxide, results in the formation of an opening 28k that extends partially through the electrically insulating layer 18, and an opening 28l in the hard mask 20 that exposes the first mask dielectric layer 20b. The first and second mask dielectric layers 20b and 20d are then selectively etched to define openings 28m and 28n in the hard mask 20, as illustrated by FIG. 2H. These openings 28m and 28n in the hard mask 20 guide the formation of a via 28o, which exposes the etch-stop layer 16, and a trench 28p in the electrically insulating layer 18. In particular, as illustrated by FIG. 2I, a selective etching step is performed to define the via 28o and the trench 28p. Then, as illustrated by FIG. 2J, a portion of the etch-stop layer 16 and remaining portions of the first mask dielectric layer 20b are selectively removed to expose the copper wiring pattern 14 and define via 28q and trench 28r. Metal damascene techniques may then be performed to fill the via 28q and trench 28r with electrically conductive materials.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a dual-damascene metal interconnect, comprising:

forming an electrically insulating layer on an integrated circuit substrate;

forming a hard mask layer comprising a stacked composite of at least four electrically insulating material layers, on the electrically insulating layer, said hard mask layer having distinct trench and via patterns therein that are respectively defined by at least first and second ones of the electrically insulating material layers, which respectively comprise first and second different insulating materials, and at least third and fourth ones of the electrically insulating material layers, which respectively comprise third and fourth different insulating materials; and selectively etching the electrically insulating layer to reflect the shape of the trench and via patterns therein, using the hard mask layer as an etching mask.

2. The method of claim 1, wherein said step of forming a hard mask layer comprises:

photolithographically patterning the stacked composite of at least four electrically insulating material layers to define the trench pattern therein; and photolithographically patterning the stacked composite of at least four electrically insulating material layers to define the via pattern therein.

3. The method of claim 1, wherein said step of forming a hard mask layer comprises forming a composite of at least four dielectric layers having respective dielectric constants greater than a dielectric constant of the electrically insulating layer.

4. The method of claim 3, wherein the composite of at least four dielectric layers includes an alternating arrangement of first and second dielectric layers having respective first and second unequal dielectric constants.

5. The method of claim 4, wherein the first dielectric layer comprises an oxide and the second dielectric layer comprises a dielectric material selected from a group consisting of SiCN, SiOC, SiON, SiOCN, SiC and SiN.

6. The method of claim 5, wherein the electrically insulating layer is an ultra-low dielectric constant material having a dielectric constant in a range between about 2.2 and about 2.4.

7. The method of claim 1, wherein said step of forming a hard mask layer comprises forming a composite of three oxide layers and two dielectric layers comprising a material selected from a group consisting of SiCN, SiOC, SiON, SiOCN, SiC and SiN; and wherein the electrically insulating layer comprises SiCOH.

8. The method of claim 1, wherein the first and third ones of the electrically insulating material layers comprise the same material; and wherein the second and fourth ones of the electrically insulating material layers comprise the same material.

9. A method of forming a dual-damascene metal interconnect, comprising:

forming an inter-metal dielectric layer on a semiconductor substrate;

forming a hard mask layer having separately photolithographically-defined trench and via patterns of unequal depths therein, on the inter-metal dielectric layer, said hard mask layer comprising a mask rework layer that contacts an upper surface of the inter-metal dielectric layer;

selectively etching the inter-metal dielectric layer to reflect the shape of the via pattern therein, using the hard mask layer as an etching mask; then etching the hard mask layer to increase a depth of the trench pattern therein, using the mask rework layer as an etch-stop layer; and then selectively etching the inter-metal dielectric layer to reflect the shape of the trench pattern therein and define a via that extends through the inter-metal dielectric layer, using the hard mask layer as an etching mask.

10. The method of claim 9, wherein said step of forming a inter-metal dielectric layer is preceded by the steps of:

forming an under-metal dielectric layer having a first wiring pattern therein, on the semiconductor substrate; and forming a first etch-stop layer on the under-metal dielectric layer.

11. The method of claim 10, wherein the inter-metal dielectric layer comprises an ultra-low dielectric constant material having a dielectric constant in a range between about 2.2 and about 2.4; and wherein forming a hard mask layer comprises:

forming the mask rework layer as a first oxide layer, on the inter-metal dielectric layer;

forming a first mask dielectric layer comprising SiCN, SiOC and/or SiON, on the mask rework layer;

forming a second oxide layer on the first mask dielectric layer;

forming a second mask dielectric layer comprising SiCN, SiOC and/or SiON, on the second oxide layer; and forming a third oxide layer on the second mask dielectric layer.

12. The method of claim 11, wherein the step of forming the third oxide layer is followed by the steps of:

selectively etching the third oxide layer to define the trench pattern in the hard mask layer, using a first photoresist mask as an etching mask;

selectively etching the second mask dielectric layer and the second oxide layer in sequence to define the via pattern therein, using a second photoresist mask as an etching mask; and selectively etching the second mask dielectric layer and the first mask dielectric layer to increase the depths of the trench and via patterns in the hard mask layer.

13. The method of claim 12, wherein the step of etching the hard mask layer to increase a depth of the trench pattern therein comprises selectively etching the first and second mask dielectric layers using at lease the first oxide layer as etch stop layer.

14. The method of claim 13, wherein said step of selectively etching the inter-metal dielectric layer to reflect the shape of the trench pattern therein and define a via that extends through the inter-metal dielectric layer is followed by a step of selectively etching the first etch-stop layer and the first mask dielectric layer for a sufficient duration to expose the first wiring pattern.

15. The method of claim 14, wherein selectively etching the first etch-stop layer and the first mask dielectric layer is followed by a step of filling the via with copper.

16. The method of claim 10, wherein the first etch-stop layer comprises SiCN, SiOC and/or SiON.

17. The method of claim 11, wherein the step of forming the third oxide layer is followed by the steps of:

selectively etching the third oxide layer, the second mask dielectric layer and the second oxide layer in sequence to define the via pattern in the hard mask layer, using a first photoresist mask as an etching mask;

selectively etching the third oxide layer to define the trench pattern therein, using a second photoresist mask as an etching mask; and selectively etching the second mask dielectric layer and the first mask dielectric layer to increase the depths of the trench and via patterns in the hard mask layer.

18. The method of claim 17, wherein the step of etching the hard mask layer to increase a depth of the trench pattern therein comprises selectively etching the first and second mask dielectric layers using the first and second oxide layers as etch stop layers.

* * * * *